(12) United States Patent
Onai et al.

(10) Patent No.: US 8,227,341 B2
(45) Date of Patent: Jul. 24, 2012

(54) SEMICONDUCTOR DEVICE AND METHOD OF MANUFACTURING THE SAME

(75) Inventors: Satoshi Onai, Ota (JP); Minoru Akaishi, Ota (JP); Hiroshi Ishizeki, Ota (JP); Yoshiaki Sano, Ashikaga (JP)

(73) Assignees: Semiconductor Components Industries, LLC, Phoenix, AZ (US); SANYO Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/646,173

(22) Filed: Dec. 23, 2009

(65) Prior Publication Data
US 2010/0164105 A1 Jul. 1, 2010

(30) Foreign Application Priority Data

Dec. 26, 2008 (JP) .................................. 2008-331927
Nov. 13, 2009 (JP) .................................. 2009-259714

(51) Int. Cl.
*H01L 21/44* (2006.01)
*H01L 29/40* (2006.01)

(52) U.S. Cl. ........ 438/652; 438/617; 438/620; 257/762; 257/780

(58) Field of Classification Search ........................ None
See application file for complete search history.

(56) References Cited

U.S. PATENT DOCUMENTS

| 6,784,554 | B2 | 8/2004 | Kajiwara et al. | |
| 2003/0127743 | A1* | 7/2003 | Brintzinger | 257/762 |
| 2007/0205520 | A1* | 9/2007 | Chou et al. | 257/780 |
| 2008/0081458 | A1* | 4/2008 | Lin et al. | 438/620 |
| 2008/0081485 | A1 | 4/2008 | Papanu et al. | |
| 2009/0096099 | A1* | 4/2009 | Hsu | 257/738 |

FOREIGN PATENT DOCUMENTS

CN 1430272 7/2003

OTHER PUBLICATIONS

T. Efland et al. (2001). "LeadFrameOnChip Offers Integrated Power Bus and Bond over Active Circuit," Proceedings of 2001 International Symposium on Power Semiconductor Devices & Ics, Osaka. p. 65-68.
Chinese Office Action dated Apr. 26, 2011, directed to Chinese Application No. 200910262202.2; 7 pages.

* cited by examiner

*Primary Examiner* — Ha Tran T Nguyen
*Assistant Examiner* — Aaron Dehne
(74) *Attorney, Agent, or Firm* — Morrison & Foerster LLP

(57) ABSTRACT

An object is to prevent a failure, such as a wiring separation or a crack, in an insulating film under a copper wire, in a semiconductor device formed by wire-bonding the copper wire on a portion above the copper wiring. A semiconductor device according to the present invention includes a copper wiring formed above a semiconductor substrate, a plated layer formed so as to cover a top surface and side surfaces of the copper wiring, and a copper wire which is wire-bonded on the plated layer above the copper wiring.

7 Claims, 4 Drawing Sheets

Prior Art

US 8,227,341 B2

SEMICONDUCTOR DEVICE AND METHOD OF MANUFACTURING THE SAME

This application claims priority from Japanese Patent Application Number JP 2008-331927 filed on Dec. 26, 2008 and JP2009-259714 filed on Nov. 13, 2009, the contents of which are incorporated herein by reference in their entirety.

BACKGROUND OF THE INVENTION

1. Field of the Invention

The present invention relates to a semiconductor device and a method of manufacturing the same, and more particularly, relates to a technique of forming a copper wire above a copper wiring.

2. Description of the Related Art

A description is given of a conventional semiconductor device with reference to the drawings.

In FIGS. 5 and 6, reference numeral 11 denotes a semiconductor substrate formed of, for example, a silicon substrate, and 12 denotes an interlayer insulating film formed on the semiconductor substrate 11. A lower-layer wiring portion 13 connected to a device element is formed in the interlayer insulating film 12.

Reference numeral 14 denotes an upper-layer wiring connected to the lower-layer wiring portion 13, and an insulating film 15 is formed so as to cover the upper-layer wiring 14.

In addition, a contact hole 16 for exposing a part of the upper-layer wiring 14 is formed in the insulating film 15, and a copper wiring 18 is formed above the insulating film 15 and inside the contact hole 16 with a barrier metal film 17 interposed therebetween.

More specifically, as shown in FIG. 5, the barrier metal film 17 is formed on the insulating film 15, and the copper wiring 18 is formed by a plating method on the barrier metal film 17 by using a resist film 19 as a mask. Then, a plated layer 20 is formed on the copper wiring 18 by using the resist film 19 as a mask. Incidentally, the plated layer 20 is a laminated film made of Ni and Pd.

Subsequently, as shown in FIG. 6, the resist film 19 is removed, and then a gold wire 21 is formed above the copper wiring 18 with the plated layer 20 interposed therebetween.

This technology is described for instance in Proceedings of 2001 International Symposium on Power Semiconductor Device & ICs, OSAKA "Lead Frame On Chip offers Integrated Power Bus and Bond over Active Circuit" pp. 6-68.

Recently, there has been a desire of implementing a semiconductor device using a copper wire, which is a low-cost material, instead of the gold wire described above.

However, in the semiconductor device structure described above, simply replacing the gold wire with the copper wire cannot ensure the reliability of the semiconductor device.

Specifically, copper is a relatively hard material (copper is three times as hard as gold). Accordingly, to prevent a bonding failure, wire bonding of a copper wire onto a copper wiring requires stronger ultrasonic waves and larger load than wire bonding of a gold wire. In this respect, even though the problem of the bonding failure is solved, experiments performed by the inventors showed an occurrence of a failure, such as a wiring separation or a crack in an insulating film formed under the copper wire.

SUMMARY OF THE INVENTION

An object of the present invention is to provide a semiconductor device and a method of manufacturing the same, by which the aforementioned problem can be solved.

The present invention has been made in view of the foregoing problem, and major aspects thereof are as follows.

Specifically, a semiconductor device of the present invention includes a copper wiring formed above a semiconductor substrate, a plated layer formed so as to cover a top surface and side surfaces of the copper wiring, and a copper wire wire-bonded onto the plated layer above the copper wiring.

The plated layer is formed of a laminated film made of Ni, Pd and Au.

A barrier metal film formed of a laminated film having Ti and Cu-seed layers is formed under the copper wiring.

Further, a method of manufacturing a semiconductor device of the present invention includes the steps of by using a resist film formed on a semiconductor substrate as a mask, forming a copper wiring by plating on a region where the resist film is not formed, after removing the resist film, forming a plated layer so as to cover a top surface and side surfaces of the copper wiring, and wire-bonding a copper wire on the plated layer above the copper wiring.

Moreover, a method of manufacturing a semiconductor device of the present invention includes the steps of forming a resist film on a barrier metal film formed on a semiconductor substrate, by using the resist film as a mask, forming a copper wiring by plating on a region where the resist film is not formed, after removing the resist film, removing the barrier metal film formed in a region where the copper wiring is not formed, by using the copper wiring as a mask, forming a plated layer so as to cover a top surface and side surfaces of the copper wiring, and wire-bonding a copper wire on the plated layer above the copper wiring.

The step of forming the plated layer is a step of laminating Ni, Pd and Au layers sequentially.

According to the present invention as described above, covering the top surface and the side surfaces with the plated layer can suppress a failure such as a wiring separation or a crack in the insulating film formed below the copper wire, even though the copper wire is wire-bonded on a portion above the copper wiring.

DESCRIPTION OF THE INVENTION

A description is given of a preferred embodiment of the invention with reference to the drawings.

Figure 1:
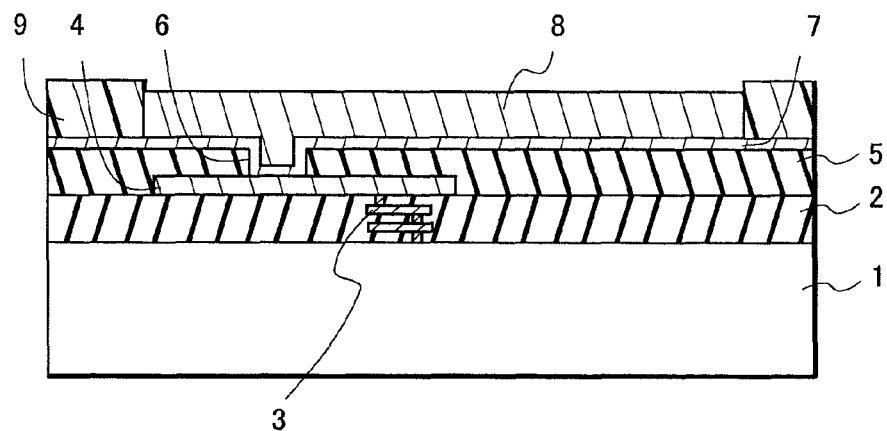
FIG. 1 is a cross-sectional diagram showing a method of manufacturing a semiconductor device according to a preferred embodiment of the invention.
Figure 2:
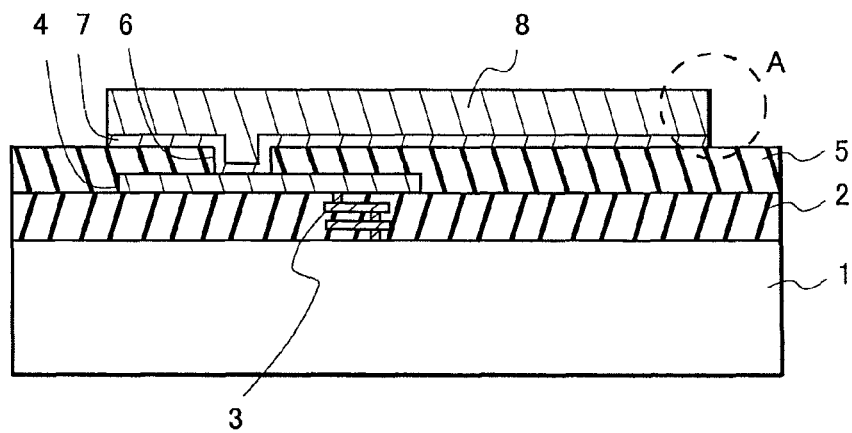
FIG. 2 is a cross-sectional diagram showing the method of manufacturing the semiconductor device according to the preferred embodiment of the invention.
Figure 3:
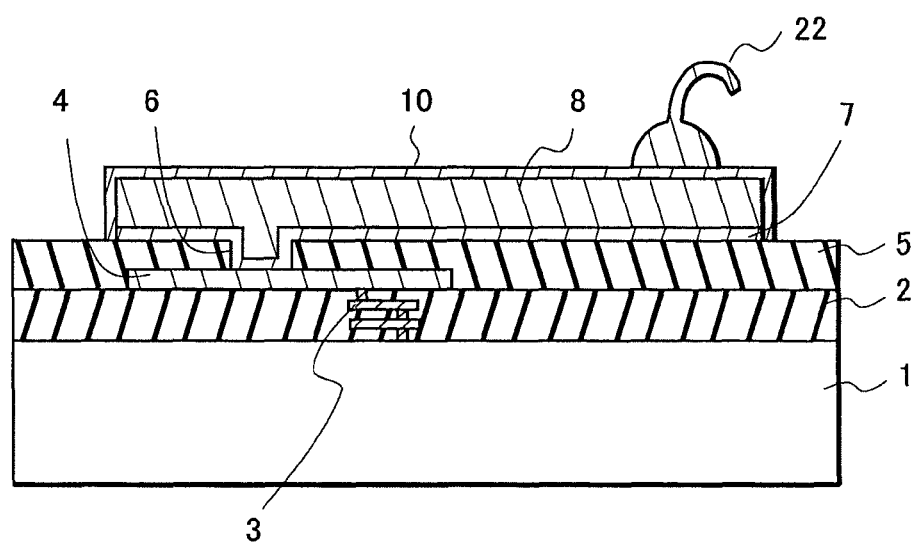
FIG. 3 is a cross-sectional diagram showing the method of manufacturing the semiconductor device according to the preferred embodiment of the invention.

In FIGS. 1 to 3, reference numeral 1 denotes a semiconductor substrate formed of, for example, a silicon substrate, and 2 denotes an interlayer insulating film formed on the semiconductor substrate 1. A lower-layer wiring portion 3 connected to a device element is formed in the interlayer insulating film 2. Note that the device element may have a BIP transistor structure or a MOS transistor structure. Any transistor structure may be applied to the device element.

Reference numeral 4 denotes an upper-layer wiring connected to the lower-layer wiring portion 3, and an insulating film 5 is formed so as to cover the upper-layer wiring 4. Note that each of the lower-layer wiring portion 3 and the upper-layer wiring 4 is formed of a metal film made of, for example, an Al alloy or the like. The insulating film 5 may be formed of, for example, a single layer of a silicon oxide film, or a laminated structure having a silicon oxide film and a silicon nitride film. Alternatively, the insulating film 5 may be made of another material.

In addition, a contact hole 6 for exposing a part of the upper-layer wiring 4 is formed in the insulating film 5, and a copper wiring 8 is formed above the insulating film 5 and inside the contact hole 6 with a barrier metal film 7 interposed therebetween. Note that the barrier metal film 7 is formed of a Ti/Cu seed layer consisting of a Ti film and a Cu seed layer each formed by a sputtering method. The film thicknesses of the Ti film and the Cu seed layer are, for example, 500 Å and 3000 Å, respectively.

As shown in FIG. 1, the copper wiring 8 is formed on the barrier metal film 7 by an electroplating method by using a resist film 9 as a mask.

Next, as shown in FIG. 2, the resist film 9 is removed, and then the barrier metal film 7 is partially removed by using the copper wiring 8 as a mask. Note that, in this embodiment, in order to remove the barrier metal film 7, firstly the Cu seed layer is removed by using a mixture of a hydrogen peroxide solution and nitric acid, and then the Ti film is removed by using a mixture of a hydrogen peroxide solution and ammonia.

Subsequently, as shown in FIG. 3, a plated layer 10 is formed on a top surface and side surfaces of the copper wiring 8 (that is, an entire exposed surface thereof). Note that the plated layer 10 has a laminated structure obtained by sequentially forming, for example, Ni, Pd and Au films. Here, the thicknesses of the Ni, Pd and Au films are, for example, 3 µm, 0.2 µm, and 0.02 µm, respectively.

Then, a copper wire 22 is bonded onto the plated layer 10 on the copper wiring 8 by a wire bonding method, and thereby a semiconductor device is completed.

Here, the Pd film forming the plated layer 10 is resistant to corrosion, and thus a protective film does not have to be formed on the plated layer 10. Incidentally, the semiconductor device may have a protective film formed on the plated layer 10. Meanwhile, if a material excellent in moisture resistance is used for the insulating film 5, it is possible to omit forming the protective film on the plated layer 10.

The experiment using the semiconductor device configured as described above according to the preferred embodiment of the invention did not show an occurrence of a failure such as a wiring separation and a crack in the insulating film 5 formed below the copper wire 22, even though the copper wire 22 was wire-bonded on a portion above the copper wiring 8.

The structure according to the preferred embodiment of the invention suppresses the failure such as a wiring separation and a crack in the insulating film 5 below the copper wire 22 after wire bonding. Although possible factors of the suppression have not been fully analyzed at this point, the inventors consider as follows.

Specifically, in the conventional structure, the plated layer 20 is formed only on a top surface of the copper wiring 18, and thus a mechanical destructive damage locally occurs on a portion under the copper wiring 18. By contrast, in the structure according to the preferred embodiment of the invention, the side surfaces of the copper wiring 8 are covered with the Ni film which is harder than copper. It is considered that this causes a surface of the insulating film 5 under the copper wiring 8 (bonding pad portion) to receive the load of the copper wire 22 evenly (disperse the load), and thereby an occurrence of the aforementioned failure can be prevented.

Figure 4A:
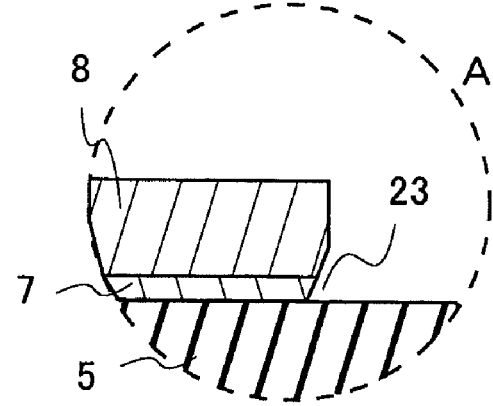
FIG. 4 is a cross-sectional diagram showing the method of manufacturing the semiconductor device according to the preferred embodiment of the invention.
Figure 4B:
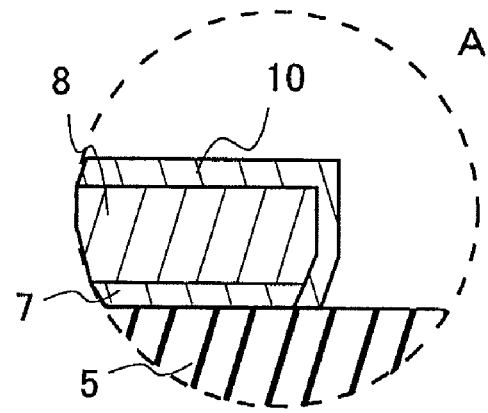
Figure 5:
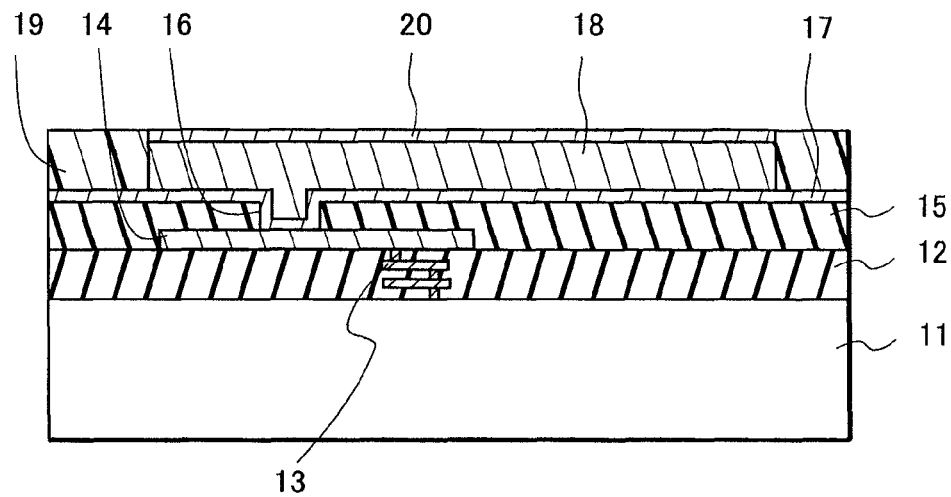
FIG. 5 is a cross-sectional diagram showing a method of manufacturing a semiconductor device according to a conventional technique.
Figure 6:
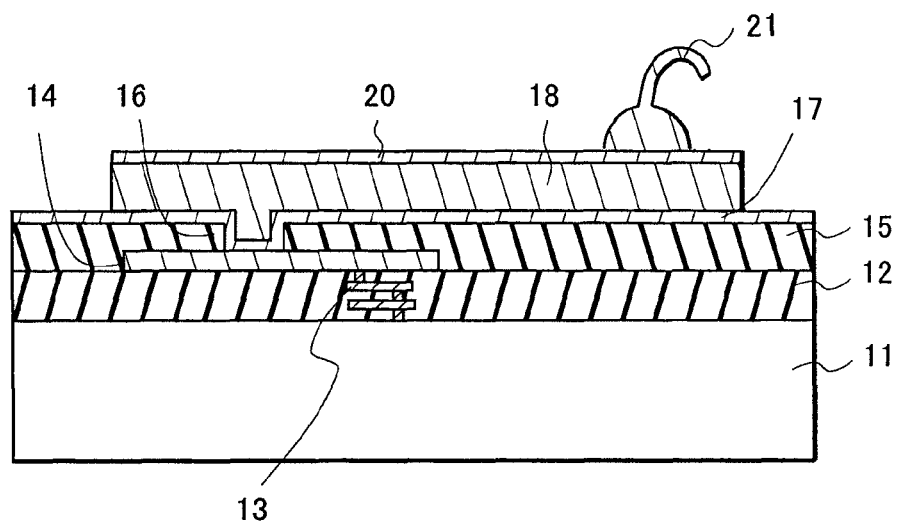
FIG. 6 is a cross-sectional diagram showing the method of manufacturing the semiconductor device according to the conventional technique.

For example, some of the possible factors are as follows. At the time of removal of the barrier metal film 7 before forming the plated layer 10 as described above, over-etching is performed so as to prevent from shorting out in the copper wiring 8. Thereby, a recessed portion 23 is formed at a lower portion of the copper wiring 8 as shown in FIG. 4A. However, since the plated layer 10 is formed on the top surface and the side surfaces of the copper wiring 8 including the recessed portion 23 (that is, the entire exposed surface of the copper wiring 8) as shown in FIG. 4B, the copper wiring 8 is considered to have an enhanced resistance also to the load mechanically applied by the wire bonding. By contrast, in the conventional structure, even though a recessed portion is formed at the lower portion of the copper wiring 18 in the same manner as in the preferred embodiment of the invention, the plated layer 20 is formed only on the top surface of the copper wiring 18 without covering the recessed portion as shown in FIG. 6. From this reason, the copper wiring 18 is considered to have a low resistance to the load mechanically applied by the wire bonding.

Furthermore, a possible factor of the bonding failure of the gold wire 21 in the conventional structure is considered to be a contamination of a top surface of the plated layer 20 due to a chemical used in the step of removing the barrier metal film 17 as shown in FIG. 6. Specifically, if wire bonding is performed with the top surface of the plated layer 20 being damaged or having a contaminant attachment due to the chemical, a eutectic reaction does not fully progress on the plated layer 20 or the gold wire 21. It is considered that this gives an adverse effect on the bonding characteristics. By contrast, according to the preferred embodiment of the invention, the barrier metal film 7 is removed by a chemical as shown in FIG. 2, and then the plated layer 10 is formed so as to fully cover the copper wiring 8. Accordingly, the plated layer 10 is not contaminated by the chemical, and no impact is given to the bonding characteristics.

Note that the above-described embodiment is provided for an exemplary purpose, and any change can be made to the material and the film thickness of the insulating film 5 and the plated layer 10.

What is claimed is:

1. A semiconductor device comprising:
   a semiconductor substrate;
   an upper-layer wiring disposed on the semiconductor substrate;
   an inorganic insulating film disposed on the upper-layer wiring and having an via hole;
   a copper wiring disposed on the insulating film so as to be connected to the upper-wiring through the via hole in the insulating film, part of the copper wiring being disposed in the via hole in the insulating film;
   a plated layer formed so as to cover a top surface and side surfaces of the copper wiring; and
   a copper wire wire-bonded onto the plated layer above the copper wiring so that an end of the copper wire is attached to the plated layer, wherein no wiring layer exists in any insulating film between the semiconductor substrate and the attached end of the copper wire.

2. The semiconductor device according to claim 1, wherein the plated layer is formed of a laminated film made of Ni, Pd and Au.

3. The semiconductor device according to any one of claims 1 and 2, wherein a barrier metal film formed of a laminated film having Ti and Cu-seed layers is formed under the copper wiring.

4. A method of manufacturing a semiconductor device, comprising:
   providing a semiconductor substrate comprising an upper-layer wiring and an inorganic insulating film disposed on the upper-layer wiring and having a via hole;
   forming a resist layer on the semiconductor substrate;
   by using the resist layer as a mask, forming a copper wiring by plating on a region of the semiconductor substrate where the resist layer is not formed, so that the copper wiring fills the via hole in the inorganic insulating film;
   removing the resist layer before forming any other layer on the copper wiring;
   after removing the resist film, forming a plated layer so as to cover a top surface and side surfaces of the copper wiring; and
   wire-bonding an end of a copper wire on the plated layer above the copper wiring so that no wiring layer exists in any insulating film between the semiconductor substrate and the bonded end of the copper wire.

5. A method of manufacturing a semiconductor device, comprising:
   providing a semiconductor substrate comprising an upper-layer wiring and an inorganic insulating film disposed on the upper-layer wiring and having a via hole;
   forming a barrier metal layer on the semiconductor substrate;
   forming a resist layer on the barrier metal layer;
   by using the resist layer as a mask, forming a copper wiring by plating on a region of the barrier metal layer where the resist layer is not formed, so that the copper wiring fills the via hole in the inorganic insulating film;
   removing the resist layer before forming any other layer on the copper wiring;
   after removing the resist film, removing the barrier metal film by using the copper wiring as a mask;
   forming a plated layer so as to cover a top surface and side surfaces of the copper wiring; and
   wire-bonding an end of a copper wire on the plated layer above the copper wiring so that no wiring layer exists in any insulating film between the semiconductor substrate and the bonded end of the copper wire.

6. The method of claim 4 or 5, wherein the forming of the plated layer comprises laminating Ni, Pd and Au layers sequentially.

7. The method of claim 5, wherein the barrier metal film comprises a laminated film having Ti and Cu-seed layers.

* * * * *